(12) United States Patent
Capasso et al.

(10) Patent No.: US 6,836,499 B2
(45) Date of Patent: Dec. 28, 2004

(54) OPTICAL AMPLIFIER FOR QUANTUM CASCADE LASER

(75) Inventors: Federico Capasso, Westfield, NJ (US); Alfred Yi Cho, Summit, NJ (US); Claire F. Gmachl, New Providence, NJ (US); Deborah Lee Sivco, Warren, NJ (US); Mariano Troccoli, Chatham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 160 days.

(21) Appl. No.: 10/155,562

(22) Filed: May 24, 2002

(65) Prior Publication Data

US 2003/0219054 A1 Nov. 27, 2003

(51) Int. Cl.[7] .............................. H01S 5/00; H01S 3/00
(52) U.S. Cl. ......................................... 372/50; 359/344
(58) Field of Search ....................... 372/43–50; 359/344

(56) References Cited

U.S. PATENT DOCUMENTS 5,260,822 A * 11/1993 Missaggia et al. .......... 359/337
5,502,787 A * 3/1996 Capasso et al. ............... 372/48
5,539,571 A * 7/1996 Welch et al. ................ 359/344

OTHER PUBLICATIONS

GMACHL, Claire et al., "High –power λ≈8µm quantum lasers with near optimum performance", Applied Physics Letters, vol. 72, No. 24, Jun. 15, 1998, pp. 3130–3132.

* cited by examiner

Primary Examiner—Quyen Leung

(57) ABSTRACT

Techniques for amplifying light produced by a quantum cascade laser are described. An assembly according to the present invention includes an optical amplifier having an optical input and an optical output. The optical output has an area significantly greater than that of the optical output and the geometry of the amplifier is such that the amplifier widens from the optical input to the optical output. The optical amplifier is formed of a layered waveguide structure which achieves quantum confinement of electrons and photons within the active region. A distributed feedback laser is suitably coupled to the optical amplifier at the optical input of the amplifier. The widening of the amplifier makes available a large number of electrons, so that the amplifier is able to produce many photons resulting from stimulated transitions caused by introduction of light to the optical input of the amplifier, even if the great majority of the transitions occur nonradiatively.

17 Claims, 6 Drawing Sheets

OPTICAL AMPLIFIER FOR QUANTUM CASCADE LASER

STATEMENT REGARDING FEDERAL RIGHTS

The U.S. Government has a paid up license in this invention and the right in limited circumstances to require the patent owner to license others on reasonable terms as provided by the terms of the contract in project DAAD19-00-C-0096 awarded by the Defense Advanced Research Projects Agency (DARPA) and the U.S. Army Research Office.

FIELD OF THE INVENTION

The present invention relates generally to lasers. More particularly, the invention relates to amplification of the optical output of a quantum cascade laser.

BACKGROUND OF THE INVENTION

Lasers have been widely used since their invention, and their use has spread to numerous applications over the years. Many different types of lasers exist, so that it is now possible to produce laser light having numerous desired wavelengths and other characteristics. A particularly interesting form of laser is the quantum cascade laser, which is especially useful for producing laser light in the infrared spectrum. The quantum cascade laser is a semiconductor laser which depends on inter-sub-band transitions to produce photons. The laser has an active region in which the transitions and the production of photons occur. During operation of a quantum cascade laser, electrons in the active region of the laser are excited by injection of a current. The excited electrons achieve a lower energy level by transitioning through a succession of energy states, each state having a lower energy than the previous state. All of these states are created in the conduction band by quantum confinement. Thus, the electron passes in steps through a succession of progressively lower energy levels and releases energy with each transition between energy levels. The design of the band structure makes it possible for the electron to emit a photon of the desired wavelength when injected into specific regions of the device, the radiative transition regions. These regions are alternated with injection/relaxation regions where the electrons lose their energy mainly by nonradiative transitions. The whole active core of the device includes usually 20 to 30 active stages, each formed by a radiative transition region and an injection/relaxation region.

Thus, for example, if an electron passes through 25 stages, it is able to emit 25 photons. The ability to induce a single electron to emit multiple photons allows the quantum cascade laser to produce significant power. In fact, quantum cascade lasers are the most powerful mid-infrared semiconductor lasers.

Prior art quantum cascade lasers are typically multi-pass devices. In a multi-pass laser, photons produced by the laser are partially channeled back into the laser, to stimulate emission of still more photons. High power operation usually requires broad area devices, but the use of prior art broad area devices tends to lead to degradation of the quality of the emitted beam. The use of an optical amplifier with a laser helps to make single-pass operation possible and also makes possible higher power output and improved beam quality, but it is difficult or impossible to use prior art techniques to design an optical amplifier that can be used with reasonable efficiency with a quantum cascade laser. Significant obstacles exist which make it difficult or impossible to design a single-pass inter-sub-band optical amplifier using the techniques of the prior art.

As noted above, quantum cascade lasers produce photons through inter-sub-band transitions of electrons. An optical amplifier produces photons by exciting electrons, for example, by injecting current into the amplifier. Light entering the optical amplifier causes stimulated transitions of the excited electrons. In order to provide optical amplification, significant numbers of the stimulated transitions must produce photons.

Inter sub-band transitions are usually mediated by phonons, and the mediation of these transitions by phonons makes nonradiative transitions much more likely to occur than spontaneous radiative transitions under conditions that typically prevail in an optical amplifier. In an inter-sub-band transition optical amplifier, the vast majority of the transitions are nonradiative, producing no photons. An inter-sub-band optical amplifier designed according to prior art techniques would waste so much current due to the production of nonradiative transitions that the amplifier would be highly inefficient at best and completely ineffective at worst. The lack of any optical amplifier which is practical for use with a quantum cascade laser makes it difficult to achieve the advantages which would be possible if such an optical amplifier were available.

There exists, therefore, a need for an optical amplifier which provides acceptable efficiency in the generation of inter-sub-band radiative transitions and which can be used with a quantum cascade laser, as well a laser for use with such an amplifier and techniques for using the laser and the amplifier together.

SUMMARY OF THE INVENTION

An assembly according to the present invention includes an optical amplifier having an optical input and an optical output. The optical output has an area significantly greater than that of the optical input and the geometry of the amplifier is such that the amplifier widens from the optical input to the optical output. The optical amplifier is formed of a layered waveguide structure which achieves quantum confinement of electrons and photons within an active region of the amplifier. A distributed feedback laser is suitably coupled to the optical amplifier at the optical input of the amplifier. The optical amplifier and the laser are suitably formed as a single monolithic structure. Injection of current into the amplifier excites electrons within the amplifier and injection of current into the laser excites electrons within the laser, causing the laser to emit photons which are received at the optical input of the amplifier. The photons received from the laser cause stimulated transitions of the excited electrons within the amplifier. Many of these transitions are nonradiative, that is, they do not produce photons. However, the widening of the amplifier makes available many more excited electrons than would be present in the absence of such widening. Therefore, sufficient radiative, that is, photon producing, stimulated transitions occur that the amplifier emits a significant number of photons as a result of stimulated transitions. The geometry of the amplifier makes it an efficient amplifier for a quantum cascade laser.

A more complete understanding of the present invention, as well as further features and advantages of the invention, will be apparent from the following Detailed Description and the accompanying drawings.

DETAILED DESCRIPTION

Figure 1A:
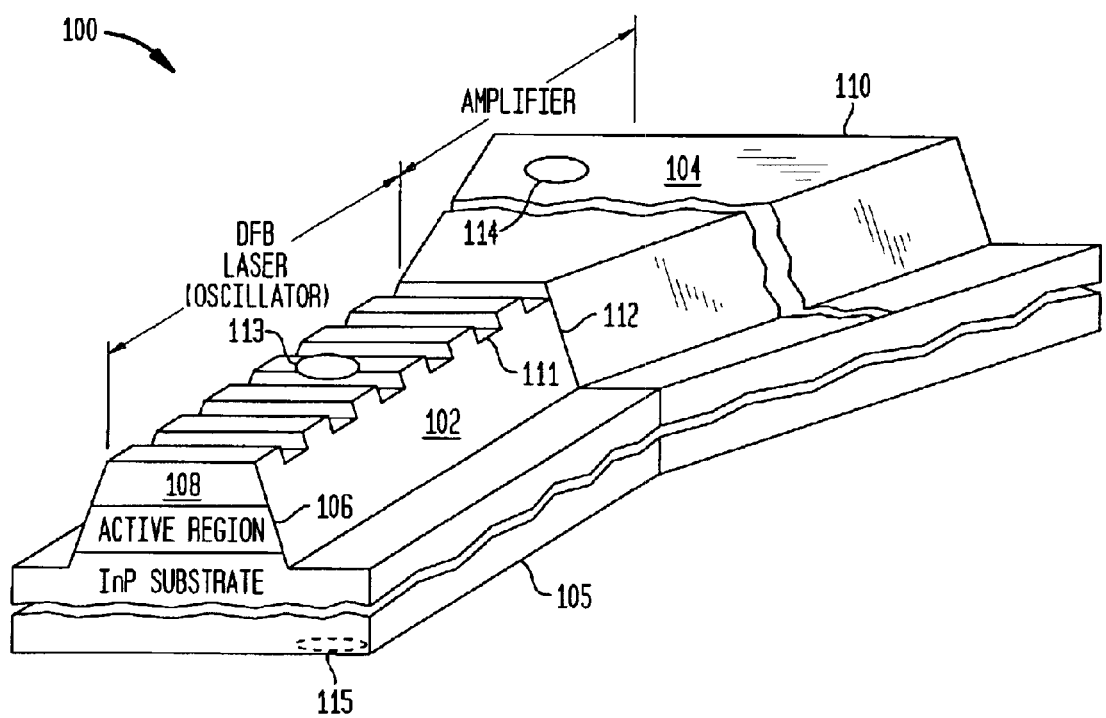
FIG. 1A illustrates a perspective view of a quantum cascade laser and optical amplifier assembly according to an aspect of the present invention.

FIG. 1A illustrates a perspective view of a laser and optical amplifier assembly 100 according an aspect of the present invention. The assembly 100 comprises a distributed feedback (DFB) laser 102 and an optical amplifier 104. The laser 102 and the optical amplifier 104 are coupled together such that the assembly 100 is configured as a master oscillator power amplifier, with the laser 102 acting as an oscillator. The assembly 100 is formed by growing a multilayer crystal lattice and then etching away the crystal lattice to achieve the proper size and shape for the assembly 100. It can be seen that the assembly 100 includes an Indium Phosphide (InP) substrate 105 and an active region 106. Additional details of the layers of the assembly 100 are illustrated in FIG. 1C and discussed below.

The assembly 100 includes a back facet 108 from which light may escape during operation of the laser 102. The assembly 100 further includes a front facet 110. The front facet 110 serves as an optical output of the amplifier 104, and of the assembly 100. The front facet 110 emits a light output resulting from generation of light by the laser 102, introduction of this light into the optical amplifier 104 and amplification and emission of this light by the optical amplifier 104.

In the exemplary embodiment illustrated here, the laser 102 may suitably be a ridge waveguide designed for single mode operation and having a length on the order of a few millimeters and a width of preferably less than 20 $\mu$m. Greater widths may be used, but a width too much greater than 20 $\mu$m may lead to an unacceptable degradation of beam quality. An appropriate exemplary length for the laser 102 is 2 millimeters and an appropriate exemplary width is 16 $\mu$m. The length and width of the laser 102 may be varied as a result of design choices, for example in order to produce a particular wavelength of light. It can be seen that the laser 102 includes a Bragg grating 111. The optical amplifier 104 is a tapered structure with no grating on top. The optical amplifier 104 can be seen to include an optical input 112, that is, a point at which the optical amplifier 104 couples to the laser 102 and receives as an input light produced by the laser 102. The length of 2 millimeters for the laser 102 is measured from the back facet 108 to the optical input 112 of the amplifier 104.

The optical amplifier 104 can be seen to widen significantly from the optical input 112 to the front facet 110. It can be seen that the optical input 112 of the optical amplifier 104 has an area substantially equal to that of the laser 102, while the optical amplifier 104 widens to a substantially increased area at the front facet 110, compared to the area at the optical input 112. The specific area of the optical amplifier 104 at the front facet 110 may vary according to design requirements, such as the wavelength of light to be produced. In order to produce sufficient output power, the front facet 110 of the optical amplifier 104 needs to be relatively wide. In order to produce a good beam quality, it is necessary that the laser 102 be relatively narrow and that the optical input 112 of the amplifier also be narrow, because the optical input 112 is the point at which light from the laser 102 enters the amplifier 104. The requirement that the optical input 112 be relatively narrow and that the front facet 110 be relatively wide leads to a requirement that the optical amplifier 104 widen significantly from the optical input 112 to the front facet 110.

The laser 102 and the optical amplifier 104 produce outputs as a result of excitation of electrons resulting from injection of energy. The laser 102 and the optical amplifier 104 include first and second contact areas 113 and 114, respectively, in order to allow injection of energy in the form electrical current. Each of the contact areas 113 and 114 is preferably made up of a dual layer of titanium and gold, with the titanium layer having a thickness of 30 nm and the gold layer having a thickness of 300 nm. The contact areas 113 and 114 are preferably placed on the top of the assembly 100 by evaporation. Providing two separate contact areas 113 and 114 allows for the current injected into the laser 102 to be controlled separately from the current injected into the optical amplifier 104. In addition, a bottom contact 115 is provided, formed of a quadruple layer of Germanium, Gold, Silver and Gold (Ge(120 nm)/Au(270 nm)/Ag(500 nm)/Au (3000 nm)), in order to provide a ground connection.

The assembly 100 may suitably be oriented at an angle of approximately 7 degrees with respect to the crystal lattice from which it is formed. This angling can be seen more clearly in FIG. 1B, discussed below. This orientation insures that any reflection from the front facet 110 back into the optical amplifier 104 is not enhanced by gain produced by the optical amplifier 100, because most of the light reflected back into the optical amplifier 104 does not couple back into the laser 102. The reason for this is that the angle between the assembly 100 and the crystal lattice produces an angling between the front facet 110 and the amplifier 104, and also between the front facet 110 and the laser 102. This angling helps insure that any light reflected back into the optical amplifier 104 does not have a direct path back into the laser 102. Therefore, little or no light reflected back into the optical amplifier 104 will enter the laser 102 and then be re-emitted by the laser 102 into the optical input 112 of the optical amplifier 104. The angled orientation, by avoiding the enhancement of reflected light, allows a high side mode suppression ratio to be achieved without any need for antireflection coatings. The avoidance of a need for antireflection coatings is particularly significant because the optical amplifier 104 is particularly suitable for operation in a wavelength range of 7 to 8 $\mu$m. At this wavelength, it is very difficult to lower the reflectivity below $10^{-2}$, and a level of reflectivity above $10^{-2}$ is sufficient to produce undesirable results.

Figure 1B:
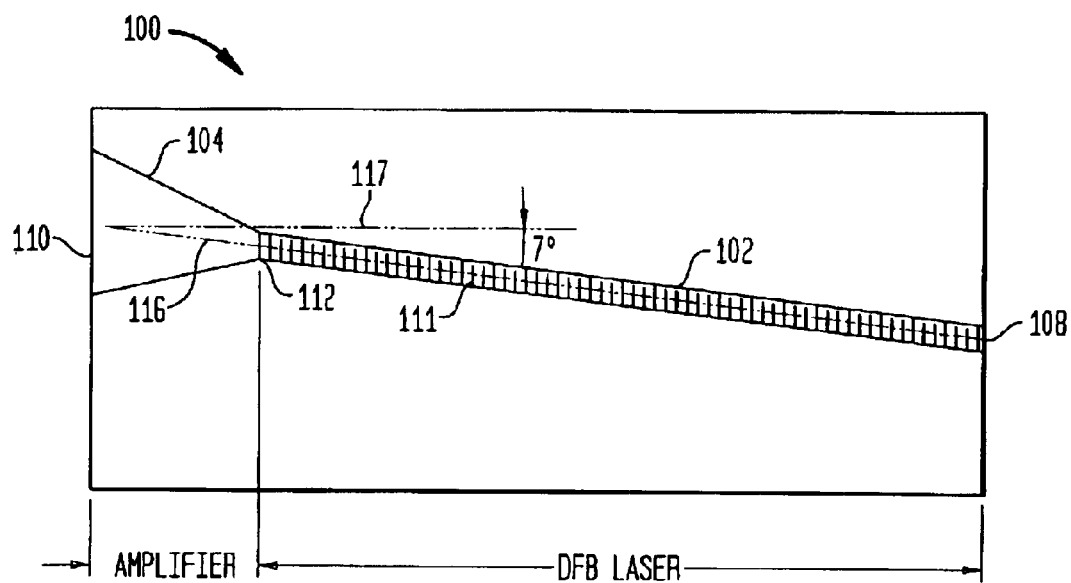
FIG. 1B illustrates a top down view of a quantum cascade laser and optical amplifier assembly according to an aspect of the present invention.
Figure 1C:
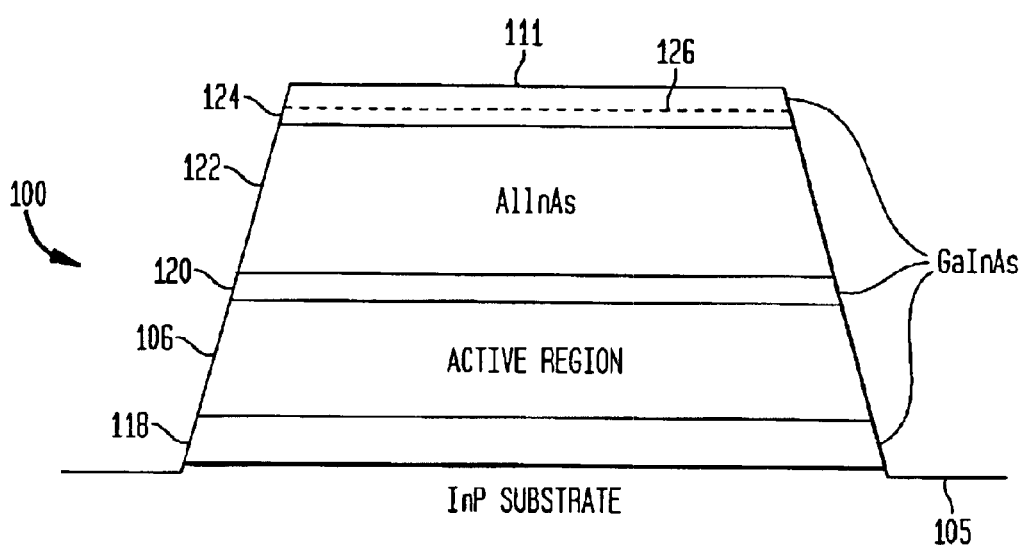
FIG. 1C illustrates a cross sectional view of a quantum cascade laser and optical amplifier assembly according to the present invention.

FIG. 1B illustrates a top down view of the assembly 100, showing the laser 102, the optical amplifier 104, the back facet 108, the front facet 110 and the optical input 112 of the optical amplifier 104. The grating 111 can also be seen. The line 116 represents an axis of the amplifier 104 and the line 117 represents the normal direction to the front facet 110. It can be seen that the front facet 110 is not normal to the axis 116, but instead is at an angle to the axis 116, due to the angling of the laser 102 and the amplifier 104 with respect to the crystal lattice from which the assembly 100 was formed. The angling between the front facet 110 and the axis 116 interferes with the path back into the laser 102 for any light reflected back into the amplifier 104. An angle of at least 3 degrees between the front facet 110 and the normal to the axis 116 greatly reduces entry of reflected light into the laser 102 and therefore reduces enhancement of the reflected light due to reemission from the laser 102 to the amplifier 104.

FIG. 1C illustrates a cross section of the assembly 100, showing the structure of the assembly 100. The perspective from which the assembly 100 is viewed is looking toward the back facet 108. The assembly 100 forms a layered waveguide structure and includes the InP substrate 105, a first Gallium Indium Arsenide (GaInAs) layer 118, the active region 106, a second GaInAs layer 120, an Aluminum Indium Arsenide (AlInAs) layer 122 and a third GaInAs layer 124. The grating 111 is etched into the third GaInAs layer 124. The dashed line 126 shows the approximate depth of the grating 111.

The substrate 105 acts as a lower cladding of the assembly 100. The first and second GaInAs layers 118 and 120 serve as cladding for the active region 106 and provide quantum confinement for electrons and photons in the active region 106. The layers and regions 106 and 118–124 may suitably be created by growing them lattice matched to the substrate 105 by molecular beam epitaxy. That is, the layers and regions 106 and 118–124 are grown using materials and techniques that allow the arrangement of atoms, or lattice, of each layer and region to match the lattice of the substrate 105 as nearly as possible.

The first GaInAs layer 118 is a 600 nm thick GaInAs layer n-doped to $5*10^{16}$ cm$^{-3}$, preferably created by crystal growth on the substrate 105. The active region 106 is a 1.33 $\mu$m thick multiple heterostructure, optimized for high power emission. Details of a structure which may be used as the active region 106 have been published by the inventors in Gmachl et al., "High power approximately 8 $\mu$m Wavelength Quantum Cascade lasers with near optimum performance," "Applied Physics Letters" Vol. 72, Issue 24, pp. 3130–3132 (1998), which is incorporated herein by reference in its entirety.

The active region 106 preferably contains 30 active stages of the "three well vertical" transition type. The second GaInAs layer 120 is a 300 nm low doped GaInAs layer, doped to n=$5*10^{16}$ cm$^{-3}$. The AlInAs layer 122 serves as an upper cladding, having a thickness of 2300 nm. The first 1500 nm thickness is doped to n=$1*10^{17}$ cm$^{-3}$ and the remaining 800 nm thickness is doped to n=$2*10^{17}$ cm$^{-3}$. The third GaInAs layer 124 serves as the top of the assembly 100 and is a heavily doped GaInAs layer, having a thickness of 500 nm and a doping of n=$5*10^{18}$ cm$^{-3}$. The third GaInAs layer 124 provides plasmon enhanced confinement.

The initial growth of the various layers creates a crystal lattice having the general shape of a rectangular solid. The assembly 100 comprising the laser 102 and the optical amplifier 104 is formed by controlled etching of this crystal lattice down to the InP substrate 105 so that the structure which remains is the assembly 100. A Silicon Nitride (SiN$_2$) layer having a thickness of 350 nm is used for electrical passivation.

The assembly 100 is able to provide single mode operation. In order to achieve such operation, the grating 111 comprises a first order Bragg grating defined by optical contact lithography, preferably placed on the layer 124 by wet etching. The grating 111 has a grating period of 1.175 $\mu$m and an etching depth of at least 300 nm. These characteristics of the grating 111 allow the layer 124 to provide the strong feedback necessary for the laser 102 to achieve single mode operation.

The interaction of the layer 124 with electromagnetic fields is described by a coupling coefficient k. The grating 111 allows the layer 124 to achieve a coupling efficiency characterized by a coupling coefficient of k=5.45 cm$^{-1}$ or more. This coupling coefficient leads to a coupling product kL=1.1, where L is the resonator length, in this case the length of the laser 102, which is approximately 2 mm. The coupling product value kL=1.1 is sufficient to allow the assembly 100 to achieve reliable single mode emission. That is, light is propagated with sufficient efficiency by the assembly 100 to achieve single mode emission.

The assembly 100 produces laser light in response to the introduction of current using the contacts 113 and 114. Introduction of the current into the laser 102 by the contact 113 excites electrons in the active region to a high energy state of the radiative transition region. Once they are in this high energy state, the electrons transition to successively lower energy states, with each transition being accompanied by emission of a photon. The structure of the laser 102 guides many of the photons to the optical input 112 of the amplifier 104. As the photons enter the amplifier 104, they stimulate transitions in electrons in the amplifier 104, many of which are in an excited state due to the amplifier current introduced by the contact 114. Many of the transitions are mediated by phonons so that the transitions occur nonradiatively, that is, without a release of a photon. However, because of the widening of the amplifier 104 from the optical input 109 to the front facet 110, many more excited electrons are available than would be the case in the absence of this widening. Therefore, the photons received from the laser 102 cause many stimulated radiative transitions, producing many photons, even though many nonradiative transitions occur and do not cause release of photons. The geometry of the amplifier 104 therefore allows the output of significant optical power, making the amplifier 104 an effective amplifier for the laser 102.

Additionally, the angling of the facets of the amplifier section prevents photons from being reflected back into the amplifier section and so avoid laser action in the amplifier. Therefore the current density in the amplifier section can be increased significantly above the intrinsic threshold current density for laser action of this material. This again provides many more electrons available for light amplification and stimulated emission induced by the injected laser light. Also, the angled shape of the amplifier 104 helps to make the amplifier 104 an efficient amplifier for quantum cascade lasers. The configuration described above allows the amplifier 104 to provide efficient single pass amplification of light received from a quantum cascade laser.

FIGS. 2–6 illustrate experimental results, illustrating the optical characteristics produced by the assembly 100 under different experimental conditions. In order to produce the results illustrated in FIGS. 2–6, an assembly similar to the assembly 100 was Indium soldered onto copper holders at a 23 degree angle and mounted into a Helium flow cryostat. The light output emitted from the front facet 110 was collected by f 0.8 Zinc Selenium (ZnSe) optics and fed into a Fourier transform spectrometer (FTIR) with a liquid nitrogen (N$_2$) cooled Mercury Cadmium Tellurium (HgCdTe) detector for spectral analysis. Pulsed optical power measurements were performed with a calibrated room temperature HgCdTe detector whose signal was sampled by a gated boxcar averager and acquired by a HEWLETT PACKARD™ 4155 semiconductor parameter analyzer.

Figure 2:
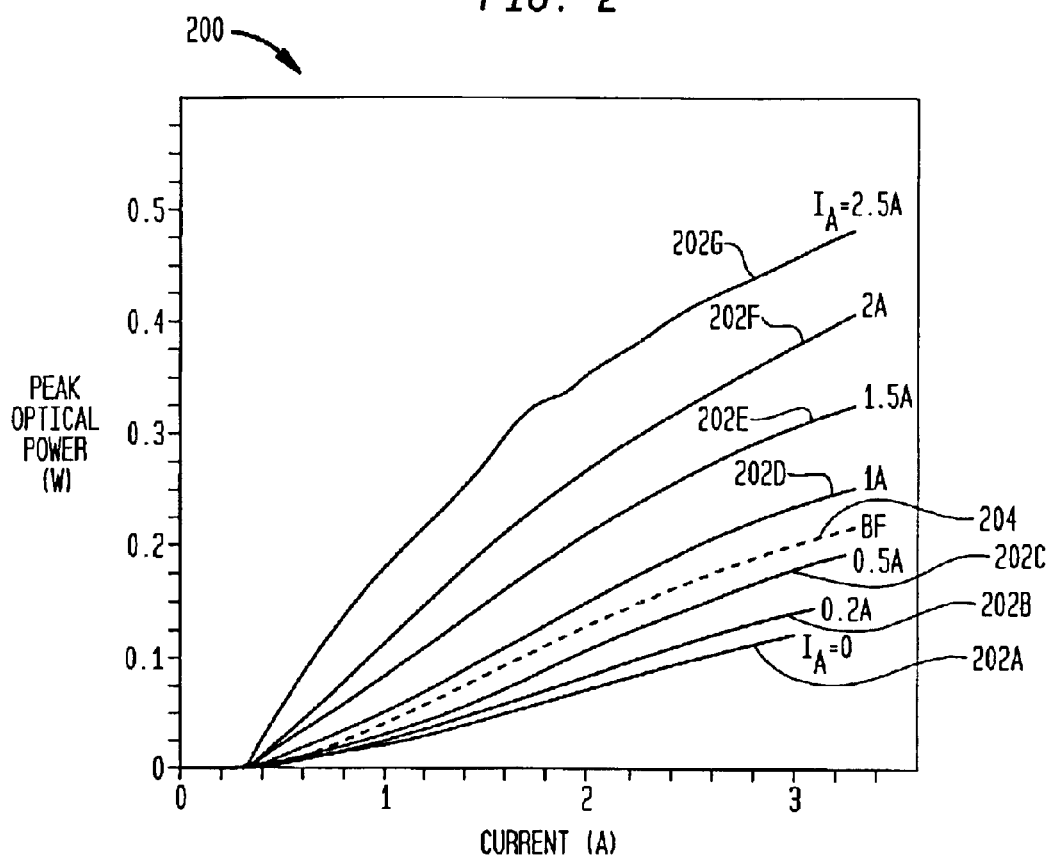
FIG. 2 is a graph illustrating relationships between laser input current, amplifier current and optical output power prevailing under a specified set of operating conditions for a laser and optical amplifier assembly according to the present invention.

FIG. 2 is a graph 200 illustrating light versus current characteristics of an assembly similar to the assembly 100. The length of the amplifier 104 was 0.54 mm and the width of the front facet 110 was 125 $\mu$m. These specifications were chosen to achieve light having a desired wavelength and other characteristics. The peak optical power achieved was measured with current pulses 100 ns wide, injected into the laser 102 at a repetition rate of 5 kHz. The amplifier 104 was also operated in pulse mode. The temperature at which the assembly 100 was operated was 80° K.

The graph 200 illustrates a family of curves 202A–202G, showing the relationship between the input current and the peak output power, at each of a number of different amplifier currents. The graph 200 also illustrates a back facet emission curve 204, showing the relationship between input current into the laser 102 and optical power of emissions from the back facet 108 of the laser 102.

It can be seen that injecting current into the amplifier 104 achieved significant amplification, with the curves 202A–202G showing an increase in optical power as a function of current, as the amplifier current was increased from 0 to 2.5A. At low amplifier currents, the optical output is less than the input power, but as the amplifier current increases, the optical output increases to substantially more than the input power.

It can be seen by examining the curves 202A–202G that the maximum power emitted by the assembly 100 is 0.5 watt, with an amplifier current of 2.5A. Comparison of the curve 202G with the curve 204 yields an estimate for the amplification of 6.4 dB. It can also be seen that in the absence of an amplifier current, or in the presence of a low level of amplifier current, emissions from the assembly 100 are subject to waveguide losses. That is, the emission from the front facet 110 of the assembly 100 is less than the emission from the back facet 108 of the laser 102. It can be seen by comparing the curve 202A with the curve 204 that the waveguide losses are approximately 12.5 dB $cm^{-1}$.

Figure 3:
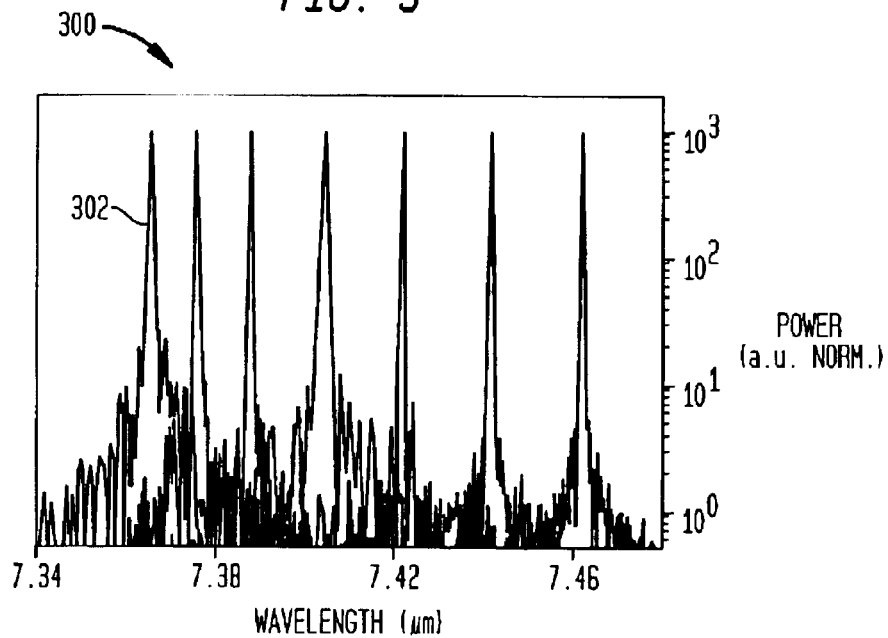
FIG. 3 is a graph illustrating the output spectra of light produced by an assembly according to the present invention having a specified configuration and operating under a specified set of conditions.

FIG. 3 is a graph 300 showing the relationship between wavelength and power of light emitted from an assembly operating at maximum power over a temperature range between 10° K. and 280° K. Power was applied in the form of pulses having a pulse width smaller than 20 ns, in order to minimize thermal chirping. It can be seen from the curve 302 that a side mode suppression ratio of 30 dB is achieved, and that the wavelength of the emitted light can be tuned between 7.36 and 7.46 $\mu$m by altering the temperature. The tuning achieved by temperature over this range of wavelengths corresponds to a temperature tuning of 0.4 nm/° K.

Figure 4:
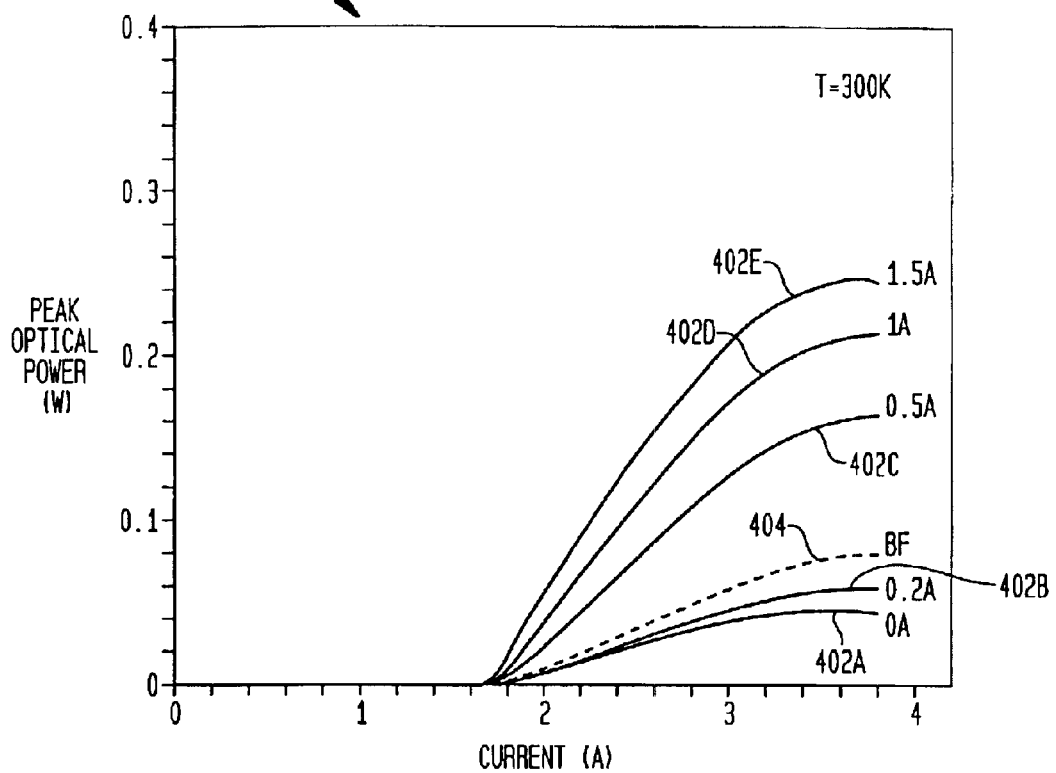
FIG. 4 is a graph illustrating relationships between laser input current, amplifier current and optical output power of a laser and optical amplifier assembly according to the present invention, the assembly operating under a different set of conditions from those illustrated in FIG. 2.

FIG. 4 is a graph 400 showing experimental results achieved by an alternative configuration of an assembly similar to the assembly 100, operating in a single pass mode. In the case illustrated in FIG. 4, the assembly included an amplifier similar to the amplifier 104, but having a length of 0.28 mm. The front facet, similar to the front facet 110 of FIGS. 1A and 1B, had a width of 52 $\mu$m. The length of 0.28 mm was chosen to allow operation in a single pass mode without excessive overheating. The graph 400 includes a family of curves 402A–402E, illustrating the relationship between input current and optical output power, for each of a plurality of amplifier current values. The graph 400 also illustrates a curve 404, illustrating the relationship of emissions from the back facet of the laser portion of the assembly to input current. The assembly was operated at 300° K. and driven with pulses having a width of 100 ns at a 0.05% duty cycle. These operational characteristics yielded an optical output power as high as 0.25 watt (W) at an amplifier current of 1.5A. It can be seen by comparing the curve 402E to the curve 404 that the maximum gain for the assembly was approximately 4.9 dB. It can further be seen by comparing the curve 402A to the curve 404 that the waveguide loss for the assembly was approximately 22 dB $cm^{-1}$.

Figure 5:
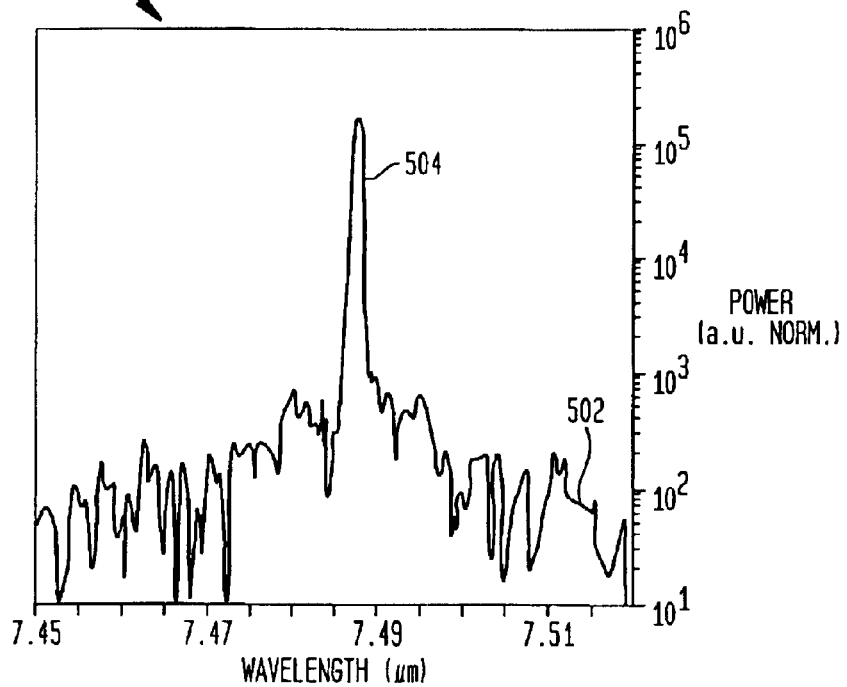
FIG. 5 is a graph illustrating the output spectra of light produced by an assembly according to the present invention having a configuration differing from that of the assembly whose output characteristics are illustrated in FIG. 3 and operating under a different set of conditions.

FIG. 5 is a graph 500 showing the relationship of output power to wavelength for the assembly providing the results illustrated in FIG. 4. It can be seen that the curve 502 has a high peak 504 at approximately 7.485 $\mu$m.

Figure 6:
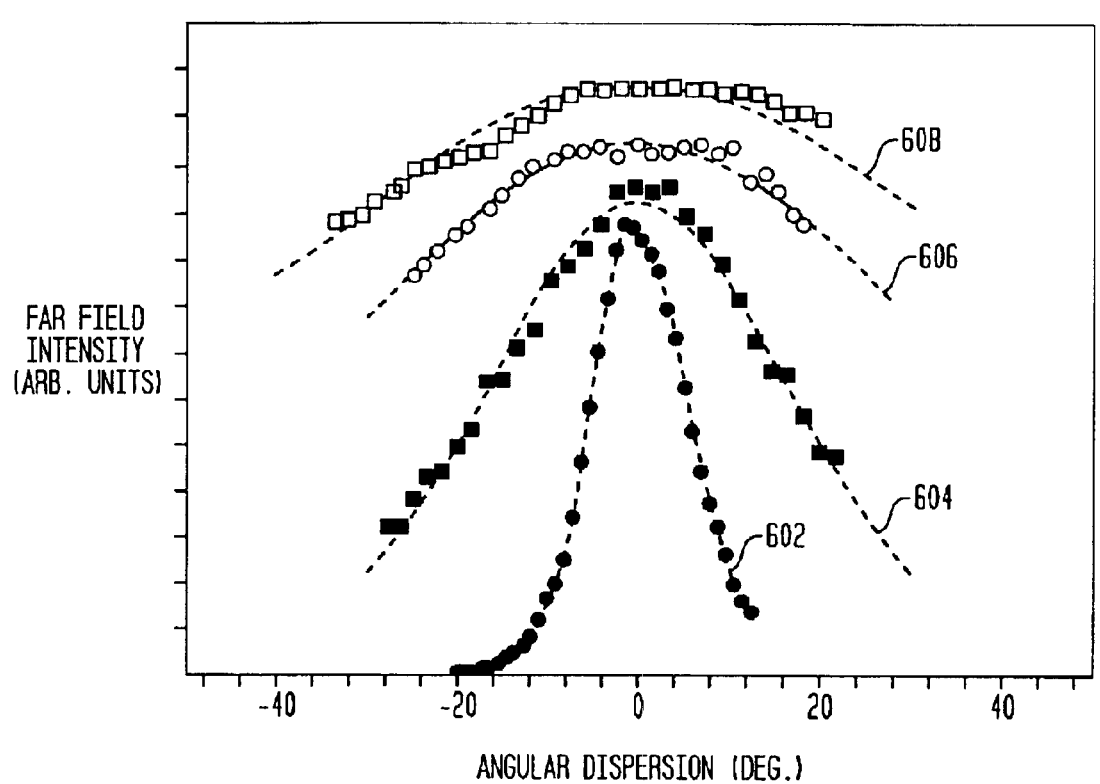
FIG. 6 is a graph illustrating the angular dispersion of the far field spectra of light emitted from an assembly according to the present invention.

FIG. 6 illustrates a graph 600 illustrating the angular dispersion of light emitted from an exemplary assembly such as the assembly 100. The graph 600 includes the curves 602–608, illustrating the relationship between far field intensity measured in arbitrary units, and angular dispersion, measured in degrees. The curves 602 and 604 represent lateral distribution patterns of emissions from the front facet 110 and the back facet 108, respectively. It can be seen that the full width half maximum (FWHM) of the emissions from the front facet 110 is as low as 12 degrees in the lateral direction. Such a distribution pattern is in contrast to those typically produced by conventional quantum cascade lasers with narrow ridges. Lasers with narrow ridges, that is, lasers having ridges with a width less than 20 $\mu$m, typically have an FWHM of 45 degrees in the lateral and 60 or more degrees in the transverse direction, respectively. Broad area lasers have a smaller divergence in the lateral direction but a far field pattern typical of higher order modes. The combination of the laser 102 with the amplifier 104 in the assembly 100 combines the advantages of a narrow ridge such as the narrow waveguide provided by the laser 102 with those of a wide facet such as the relatively wide output facet 110. The wavefront traveling in the laser 102, which provides a 16 $\mu$m wide waveguide, is adiabatically expanded within the tapered amplifier 104, preserving the quality of the emitted beam and insuring that the beam is subjected to a much lower diffraction by the wide amplifier output facet 110. This can be seen by the relatively narrow dispersion, combined with the relatively high far field intensity, of the curve 602.

The curves 606 and 608 represent transverse field distributions, which are relatively wide, and comparable to distributions achieved by other quantum cascade devices.

Figure 7:
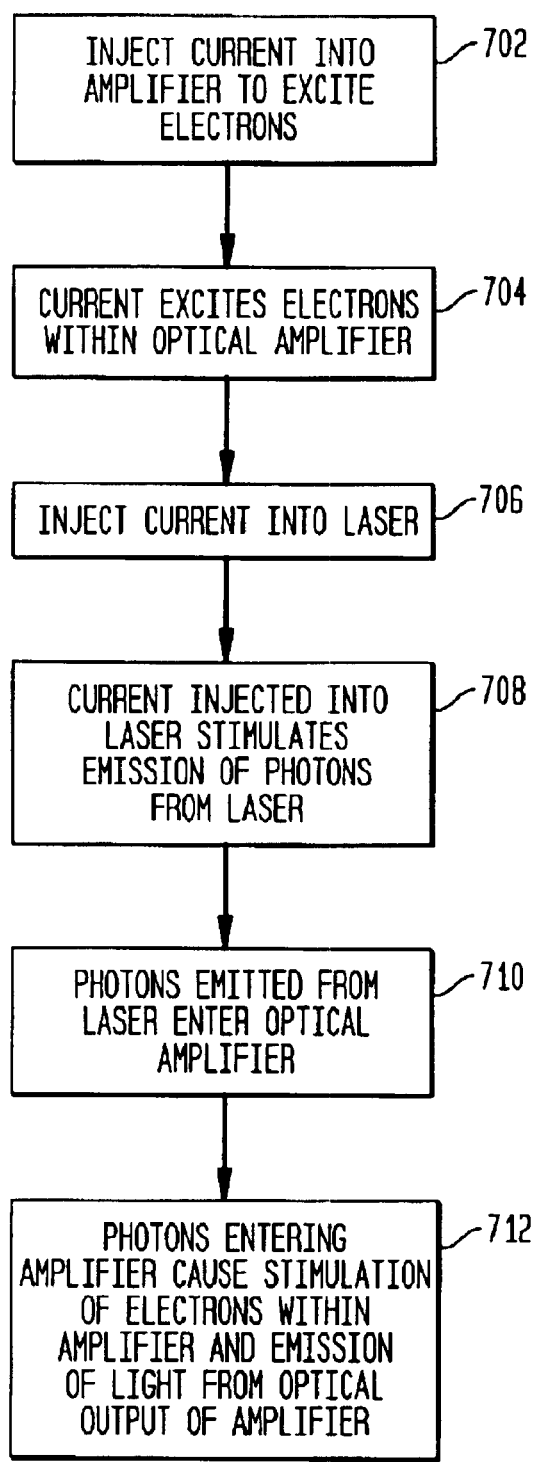
FIG. 7 is a process of laser light amplification according to the present invention.

FIG. 7 illustrates the steps of a method 700 of generating amplified laser light according to the present invention. At step 702, current is injected into an optical amplifier according to the present invention. The optical amplifier may suitably be similar to the amplifier 104 of FIGS. 1A–1C, having an optical output greater in area than the area of the optical input. The amplifier may suitably be of a geometry such that the amplifier widens from the optical input to the optical output. At step 704, the injected current excites electrons within the optical amplifier. At step 706, current is injected into a laser having an output coupled to the optical input of the amplifier. At step 706, the current injected into the laser stimulates the generation of photons and emission of the photons from the laser and into the optical amplifier. At step 708, the photons emitted from the laser enter optical amplifier through the optical input of the optical amplifier. At step 710, the photons entering the optical amplifier cause stimulation of excited electrons within the amplifier and emission of light from the optical output of the amplifier.

Injection of current into the laser excites electrons within the laser, causing them to produce photons which will enter into the amplifier. Injection of current into the amplifier excites electrons within the amplifier. The photons from the laser interact with the excited electrons within the amplifier and cause stimulated transitions of these electrons. These stimulated transitions cause a release of energy. On the other hand, most of the transitions cause a nonradiative release of energy. That is, the transitions are not accompanied by a release of a photon. However, because the amplifier widens from the optical input to the optical output, and has an angled facet, the amplifier provides a larger volume of excited electrons than would be available of this widening were not present and can be driven under a higher current density than can the laser material. This large volume and number of excited electrons allows for a larger number of stimulated transitions than would otherwise be possible, and allows efficient amplification of the photons received from the laser.

While the present invention is disclosed in the context of a presently preferred embodiment, it will be recognized that a wide variety of implementations may be employed by persons of ordinary skill in the art consistent with the above discussion and the claims which follow below.

We claim:

1. A quantum cascade optical amplifier comprising:
   a quantum cascade waveguide structure comprising a layered semiconductor structure including a plurality of quantum wells capable of radiating light through intersubband transitions;
   an optical input having an area for receiving light; and
   an optical output for emitting light produced as a result of amplification of the light received at the optical input, the optical output having an optical facet with an area larger than said area of the optical input, the waveguide structure widening from the optical input to the optical output.

2. The amplifier of claim 1, wherein the waveguide structure comprises an active region bounded by cladding layers, the cladding layers providing optical confinement for photons within the active region.

3. The amplifier of claim 2, wherein amplification of light received at the optical input is achieved by injecting current into the active region to excite charge carriers within the active region.

4. The amplifier of claim 1, wherein the optical facet of the optical output has an angle of at least 3 degrees to the normal to the axis of the optical amplifier.

5. A monolithic structure for producing amplified laser light, comprising:
   a distributed feedback quantum cascade laser comprising a layered semiconductor structure including a plurality of quantum wells capable of radiating light through intersubband transitions;
   a quantum cascade optical amplifier comprising a layered semiconductor structure including a plurality of quantum wells capable of radiating light through intersubband transitions and coupled to the laser, the optical amplifier being coupled to the laser at an optical input of the optical amplifier, the optical amplifier including an optical output, the optical output having an area significantly greater than the area of the optical input of the amplifier.

6. The structure of claim 5 wherein the structure is formed by growing a multilayer crystal lattice on a substrate and etching away selected portions of the crystal lattice to achieve a proper size and shape for the structure.

7. The structure of claim 5 wherein the structure is oriented at an angle of approximately 7 degrees with respect to the axis of the crystal lattice.

8. The structure of claim 5 wherein the laser is a master oscillator comprising a ridge waveguide designed for single mode operation.

9. The structure of claim 5 wherein the laser includes a Bragg grating etched into a top layer of the laser.

10. The structure of claim 9 wherein the grating is a first order Bragg grating.

11. The structure of claim 10 wherein the grating has dimensions such that the top layer provides a coupling coefficient of at least 5.45 cm$^{-1}$.

12. The structure of claim 5 wherein the laser has a width less than 20 $\mu$m.

13. The structure of claim 12 wherein the optical input of the amplifier has a width of less than 20 $\mu$m and the optical output of the amplifier has a width of greater than 100 $\mu$m.

14. The structure of claim 5 wherein the laser includes a first contact area for injection of current into the laser and the amplifier includes a second contact area for injection of current into the amplifier, the first and second contact areas allowing injection of different levels of current into the laser and the amplifier.

15. A method of laser light generation and amplification comprising the steps of:
   injecting current into an active region of a quantum cascade optical amplifier, the active region comprising a layered semiconductor structure including a plurality of quantum wells capable of radiating light through intersubband transitions, the optical amplifier having an optical input and an optical output, the optical output having an area, the optical input having an area, the area of the optical output being greater than the area of the optical input; and
   introducing light into the optical input of the amplifier to stimulate intersubband transitions by charge carriers in the plurality of quantum wells.

16. The method of claim 15 wherein the step of introducing light into the optical input of the amplifier includes injecting current into a quantum cascade laser coupled to the optical input of the amplifier to cause emission of photons from the laser into the optical input of the amplifier.

17. An optical amplifier comprising:
   an optical input for receiving light to be amplified;
   an optical output for emitting light after amplification; and
   a quantum cascade waveguide between the optical input and the optical output, the waveguide being configured to provide single pass amplification of light received from the optical input, the waveguide including a plurality of quantum wells capable of radiating light through intersubband transitions; the waveguide being tapered so that the optical input is smaller in area than the optical output and the waveguide widens from the optical input to the optical output.

* * * * *